United States Patent
Wu et al.

(10) Patent No.: US 11,569,749 B2
(45) Date of Patent: Jan. 31, 2023

(54) WIDE INPUT VOLTAGE RANGE POWER CONVERTER CIRCUIT IN A ONE-STAGE-TWO-SWITCH CONFIGURATION

(71) Applicant: MINMAX TECHNOLOGY CO., LTD., Tainan (TW)

(72) Inventors: Cheng-Chou Wu, Tainan (TW); Chien-Ming Chen, Tainan (TW)

(73) Assignee: MINMAX TECHNOLOGY CO., LTD., Tainan (TW)

( * ) Notice: Subject to any disclaimer, the term of this patent is extended or adjusted under 35 U.S.C. 154(b) by 84 days.

(21) Appl. No.: 17/088,764

(22) Filed: Nov. 4, 2020

(65) Prior Publication Data

US 2021/0152096 A1 May 20, 2021

(30) Foreign Application Priority Data

Nov. 18, 2019 (TW) ................................ 108141801

(51) Int. Cl.
*H02M 3/335* (2006.01)
*G01R 19/165* (2006.01)
(Continued)

(52) U.S. Cl.
CPC .. *H02M 3/33553* (2013.01); *G01R 19/16538* (2013.01); *H02M 3/33569* (2013.01);
(Continued)

(58) Field of Classification Search
CPC .. H02M 3/1582; H02M 3/1584; H02M 3/285; H02M 3/33561; H02M 7/49;
(Continued)

(56) References Cited

U.S. PATENT DOCUMENTS 7,729,135 B1 6/2010 Schimel
2005/0281059 A1 12/2005 Yasumura
(Continued)

FOREIGN PATENT DOCUMENTS

CN 113938025 * 9/2022
TW 201537883 A 10/2015
(Continued)

*Primary Examiner* — Thienvu V Tran
*Assistant Examiner* — Nusrat Quddus
(74) *Attorney, Agent, or Firm* — Alan D. Kamrath; Karin L. Williams; Mayer & Williams PC (57) ABSTRACT

A wide input voltage range power converter circuit in a one-stage-two-switch configuration has a power input terminal, a switch node connected to the power input terminal, a transformer, two electronic switches, a pulse width modulation (PWM) circuit, and an output circuit. An input side of the transformer has a first winding and a second winding that are connected to the switch node. An output side of the transformer has an output winding. A turns ratio between the first winding and the output winding is different from a turns ratio between the second winding and the output winding. The two electronic switches are respectively connected to the first winding and the second winding in series. The PWM circuit is connected to the power input terminal and control terminals of the two electronic switches. The output circuit is connected to the output winding.

8 Claims, 4 Drawing Sheets

(51) Int. Cl.
*H03K 5/24* (2006.01)
*H02M 1/00* (2006.01)

(52) U.S. Cl.
CPC ........ *H02M 3/33576* (2013.01); *H03K 5/24* (2013.01); *H02M 1/0009* (2021.05); *H02M 1/0025* (2021.05)

(58) Field of Classification Search
CPC .......... H02M 3/46; H02M 3/38; H02M 1/045; H02M 7/006; H02M 7/06; H02M 7/068; H02M 7/153; H02M 7/10; H02M 1/088; H02M 7/103; H02M 7/106; H02M 7/19; H02M 7/08; H02M 7/17; H02M 2001/007; H02M 7/493; H02M 7/53806; H02M 7/5381; H02M 7/483; H02M 7/217; H02M 7/538466; H02M 7/5387; H02M 7/53871; H02M 7/53873; H02M 7/53875; H02M 1/084; H02M 1/0845; G01R 19/165; G01R 19/16504; G01R 19/16509; G01R 19/16514; G01R 19/16519; G01R 19/16523; G01R 19/16528; G01R 19/16533; G01R 19/16538; G01R 19/16542; G01R 19/16547; G01R 19/16552; G01R 19/16557; G01R 19/16561; G01R 19/16566; G01R 19/16571; G01R 19/16576; G01R 19/1658; G01R 19/16585; G01R 19/1659; G01R 19/16595; G01R 19/17
See application file for complete search history.

(56) References Cited

U.S. PATENT DOCUMENTS

| | | | |
|---|---|---|---|
| 2009/0212758 A1* | 8/2009 | Asinovski | H02M 3/33569 323/355 |
| 2011/0305043 A1* | 12/2011 | Matsumoto | H02M 3/33592 363/21.01 |
| 2012/0230086 A1 | 9/2012 | Lai et al. | |
| 2012/0250369 A1* | 10/2012 | Furukawa | H02M 3/337 363/25 |
| 2014/0029314 A1* | 1/2014 | Gillmor | H02M 3/158 363/21.09 |
| 2016/0261192 A1 | 9/2016 | Karlsson et al. | |
| 2016/0365794 A1 | 12/2016 | Lawson et al. | |
| 2017/0179831 A1* | 6/2017 | Yu | H02M 3/33569 |
| 2019/0058387 A1 | 2/2019 | Shimura et al. | |
| 2020/0083819 A1* | 3/2020 | Wang | H02M 1/0064 |
| 2020/0244175 A1 | 7/2020 | Mahdavikhah-Mehrabad et al. | |

FOREIGN PATENT DOCUMENTS

| | | | | |
|---|---|---|---|---|
| TW | 201924203 A | 6/2019 | | |
| WO | WO-2009105734 A2 * | 8/2009 | ............. | H02M 1/10 |
| WO | WO-2012155325 A1 * | 11/2012 | ............. | H02M 1/10 |
| WO | WO2012155325 A1 | 11/2012 | | |
| WO | WO2019181644 | 9/2019 | | |

\* cited by examiner

WIDE INPUT VOLTAGE RANGE POWER CONVERTER CIRCUIT IN A ONE-STAGE-TWO-SWITCH CONFIGURATION

CROSS REFERENCE TO RELATED APPLICATIONS

The present application claims priority to Taiwan application No. 108141801, filed on Nov. 18, 2019, the content of which is hereby incorporated by reference in its entirety.

BACKGROUND OF THE INVENTION

1. Field of the Invention

The present application relates generally to a power converter circuit, and more particularly to a wide input voltage range power converter circuit in a one-stage-two-switch configuration.

2. Description of Related Art

Figure 4:
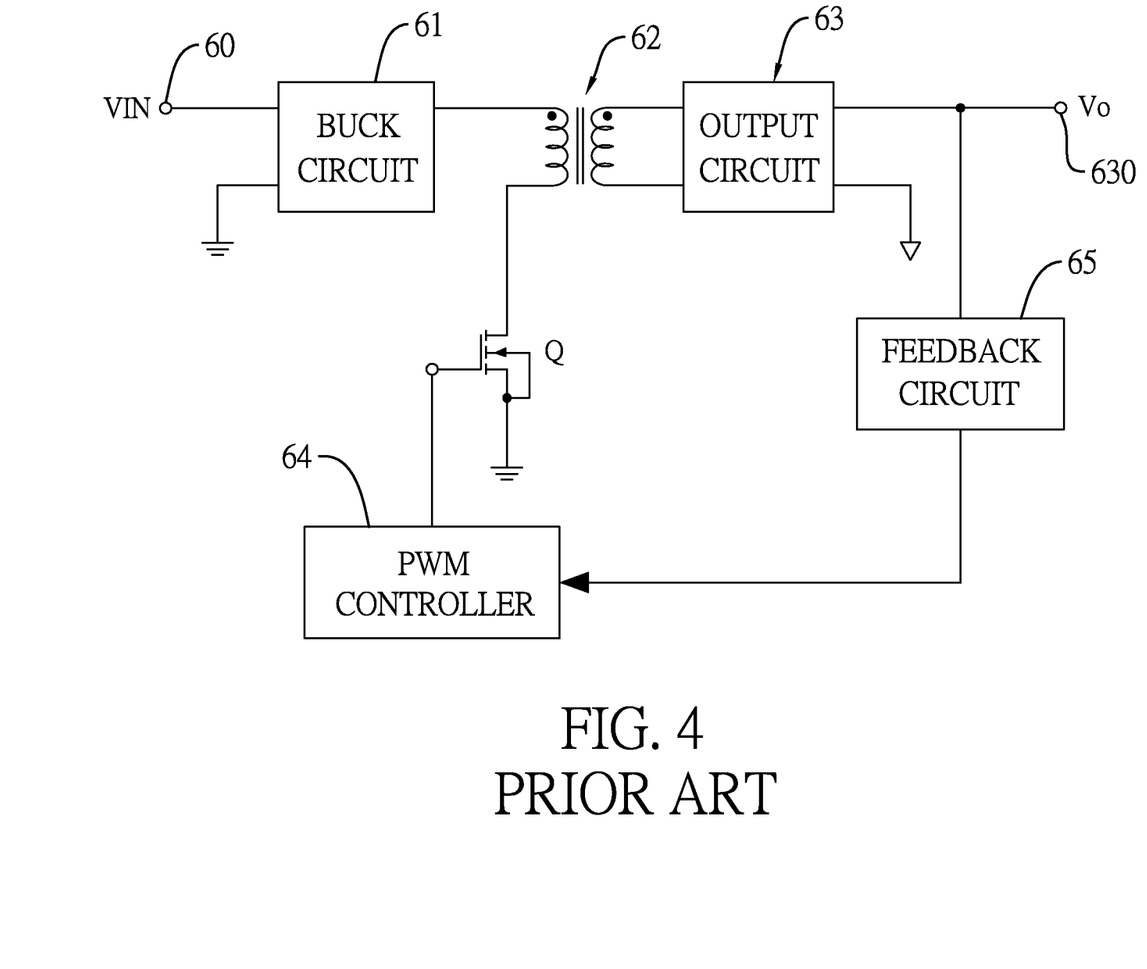
FIG. 4 is a circuit schematic diagram of a conventional wide input voltage range power converter circuit.

With reference to FIG. 4, a conventional wide input voltage range power converter circuit comprises a power input terminal 60, a buck circuit 61, a transformer 62, an output circuit 63, a pulse width modulation (PWM) controller 64, a feedback circuit 65, and an electronic switch Q.

The power input terminal 60 is provided to receive an input voltage VIN. The buck circuit 61 is connected between the power input terminal 60 and an input side (primary side) of the transformer 62. The output circuit 63 is connected between an output side (secondary side) of the transformer 62 and a power output terminal 630. The electronic switch Q is connected to a winding of the input side of the transformer 62 in series and has a control terminal. The PWM controller 64 has an output terminal connected to the control terminal of the electronic switch Q to output a PWM signal to activate the electronic switch Q to work. Generally, the PWM controller 64 may modulate pulse widths of the PWM signal according to the current on the input side of the transformer 62 and/or the output voltage Vo of the power output terminal 630. As shown in FIG. 4, the feedback circuit 65 is connected between the power output terminal 630 and an input terminal of the PWM controller 64 for the PWM controller 64 to obtain a magnitude of the output voltage Vo.

However, the conventional wide input voltage range power converter circuit has shortcomings including:

1. The buck circuit 61 plays a role of a first-stage voltage regulator. The transformer 62 plays a role of a second-stage isolator. It is to be understood that the conventional power converter circuit is constructed in a two-stage configuration, and therefore two times of power conversion have to be undergone, such that power conversion efficiency is hardly improved.

2. Turns ratio of the windings of the input side and the output side of the transformer 62 is single and fixed. As a result, the performance of the duty cycle of the transformer 62 is restricted. For example, when a super-wide input voltage range (such as from 9V to 160V) is applied to the conventional power converter circuit, the conventional power converter circuit would have poor performance at lower input voltage and higher input voltage within the super-wide input voltage range. In other words, energy fails to be effectively transmitted from the power input terminal VIN to the power output terminal 630. Therefore, for the application of wide input voltage range, its efficiency fails to accomplish a more ideal performance.

SUMMARY OF THE INVENTION

An objective of the present invention is to provide a wide input voltage range power converter circuit in a one-stage-two-switch configuration, in order to overcome the shortcomings, including the power conversion efficiency hardly to be improved and poor performance at lower input voltage and higher input voltage within a super-wide input voltage range, of the conventional power converter circuit.

The wide input voltage range power converter circuit in a one-stage-two-switch configuration comprises a power input terminal, a switch node, a transformer, a first electronic switch, a second electronic switch, a pulse width modulation (PWM) circuit, and an output circuit.

The switch node is connected to the power input terminal. The transformer has an input side and an output side. The input side comprises a first winding and a second winding that are connected to the switch node. The output side comprises an output winding. A turns ratio between the first winding and the output winding is different from a turns ratio between the second winding and the output winding. The first electronic switch is connected to the first winding in series and has a control terminal. The second electronic switch is connected to the second winding in series and has a control terminal. The PWM circuit comprises a comparison unit and a PWM controller. The comparison unit has a detecting terminal connected to the power input terminal, a setting terminal for a voltage switching threshold, a PWM input terminal, a first signal output terminal connected to the control terminal of the second electronic switch, and a second signal output terminal connected to the control terminal of the first electronic switch. The PWM controller has a PWM output terminal connected to the PWM input terminal of the comparison unit. The output circuit is connected to the output winding of the transformer and comprises a power output terminal.

Compared with the conventional power converter circuit, the present invention includes advantages including:

1. In the present invention, the input side of the transformer is connected to the power input terminal via the switch node. The present invention does not have the first-stage voltage regulator included in the conventional power converter circuit. Hence, the present invention is constructed in a one-stage-two-switch configuration to improve the power conversion efficiency.

2. Different from the transformer of the conventional power converter circuit having the single and fixed turns ratio, the input side of the transformer of the present invention includes the first winding and the second winding, such that the turns ratio between the first winding and the output winding is different from the turns ratio between the second winding and the output winding. Based on the two different turns ratios, the present invention may be applied to a super-wide input voltage range. For example, the turns ratio between the first winding and the output winding is adapted to a lower input voltage range, and the turns ratio between the second winding and the output winding is adapted to a higher input voltage range. On the whole, a combination of the lower voltage range and the higher voltage range forms the super-wide input voltage range. Hence, the present invention may operate within the super-wide input voltage range and retain ideal power conversion efficiency.

DETAILED DESCRIPTION OF PREFERRED EMBODIMENT(S)

Figure 1:
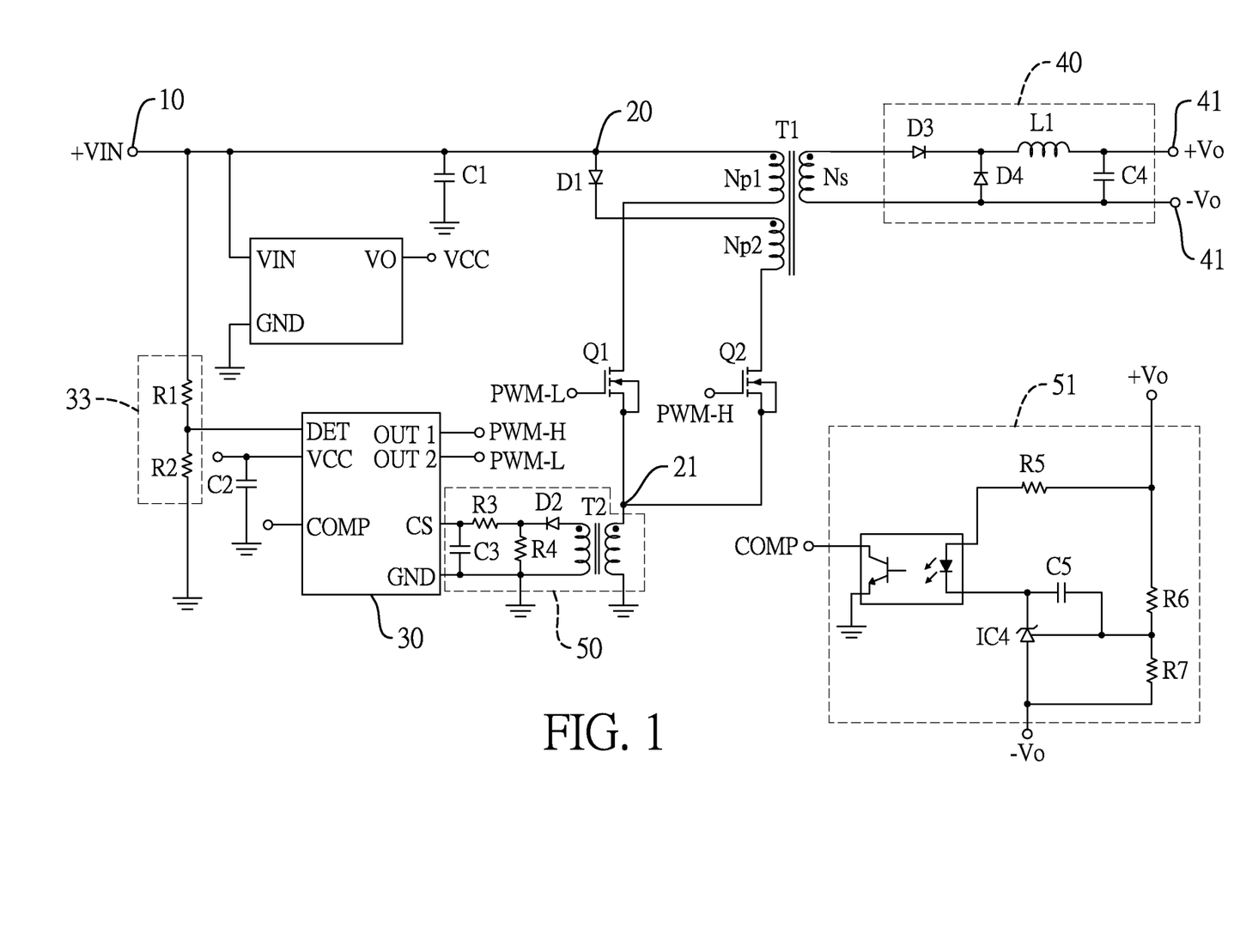
FIG. 1 is a circuit schematic diagram of an embodiment of the wide input voltage range power converter circuit in a one-stage-two-switch configuration of the present invention.
Figure 2:
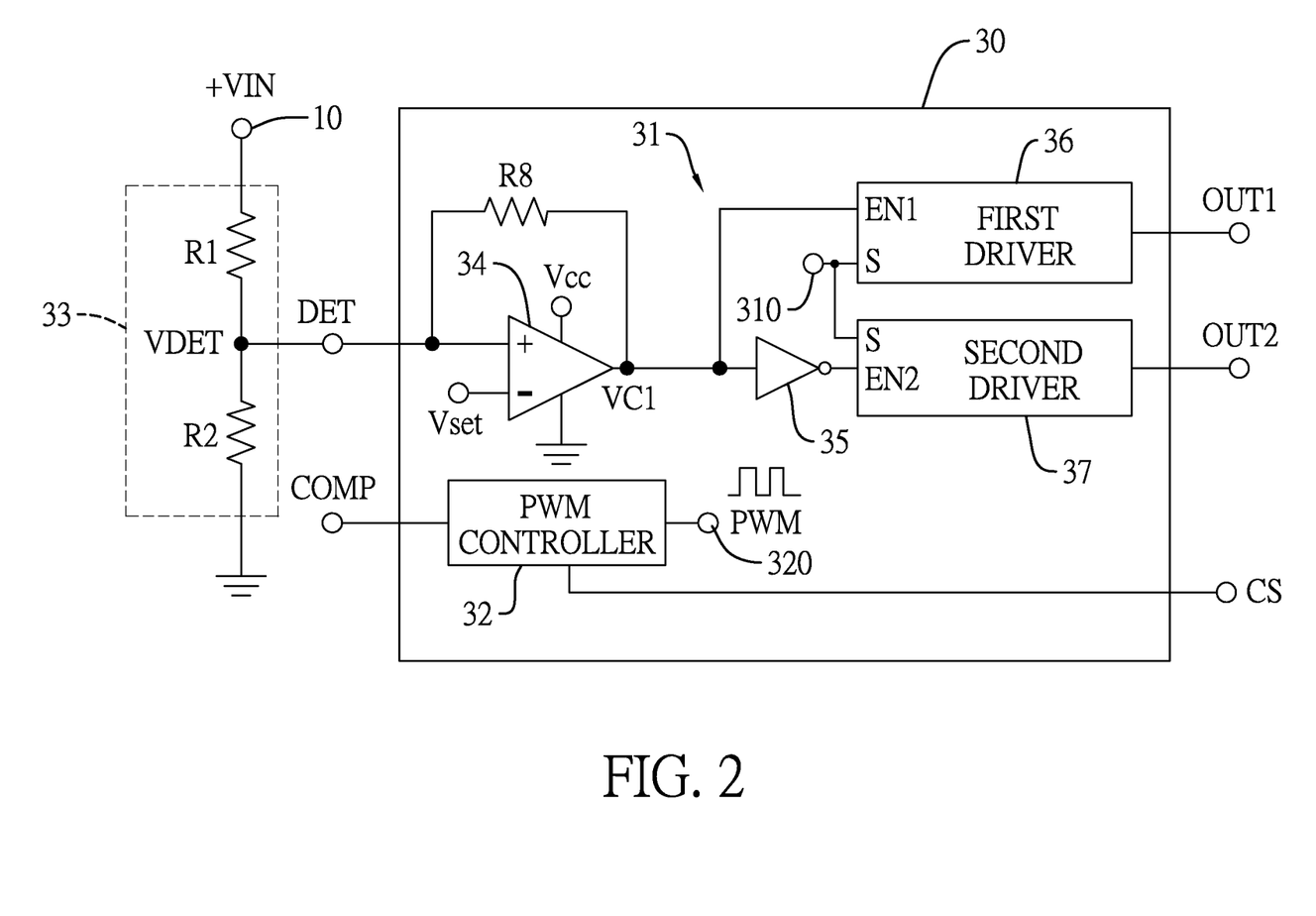
FIG. 2 is a circuit schematic diagram of the PWM circuit of the present invention.

With reference to FIG. 1 and FIG. 2, the wide input voltage range power converter circuit in a one-stage-two-switch configuration of the present invention comprises a power input terminal 10, a switch node 20, a transformer T1, a first electronic switch Q1, a second electronic switch Q2, a pulse width modulation (PWM) circuit 30, and an output circuit 40. A forward circuit is taken as an example for the circuit configuration of the present invention, but the circuit configuration of the present invention is not be limited to the forward circuit. For instance, a flyback circuit or a push-pull circuit may be performed in the circuit configuration.

The power input terminal 10 is provided to be connected to a pre-stage circuit to receive a direct-current (DC) input voltage (+VIN). For example, a voltage range of the input voltage (+VIN) may be a super-wide input voltage range from 9V to 160V. The switch node 20 is connected to the power input terminal 10. In the embodiment of the present invention, the switch node 20 may be directly connected to the power input terminal 10.

The transformer T1 has an input side (primary side) and an output side (secondary side). The input side comprises a first winding Np1 and a second winding Np2. The first winding Np1 and the second winding Np2 are connected to the switch node 20. The output side comprises an output winding Ns. A winding number of the first winding Np1 is different from a winding number of the second winding Np2, Hence, a turns ratio between the first winding Np1 and the output winding Ns is different from a turns ratio between the second winding Np2 and the output winding Ns. The output circuit 40 has an input terminal connected to the output winding Ns. Besides, the output circuit 40 comprises a power output terminal 41. With reference to FIG. 1 a terminal of the first winding Np1 is directly connected to the switch node 20. A terminal of the second winding Np2 is connected to the switch node 20 via an anti-backflow device D1. In the embodiment of the present invention, the anti-backflow device D1 is a single diode connected to the second winding Np2 in series and having an anode and a cathode. The anode of the single diode is directly connected to the switch node 20. The cathode of the single diode is connected to the second winding Np2.

The first electronic switch Q1 is connected to the first winding Np1 in series. In the embodiment of the present invention, the first electronic switch Q1 has a first terminal, a second terminal, and a control terminal. The first terminal of the first electronic switch Q1 is connected to another terminal of the first winding Np1. For example, the first electronic switch Q1 may be an n-type metal-oxide-semiconductor field effect transistor (n-MOSFET). In the first electronic switch Q1, the first terminal may be Drain, the second terminal may be Source, and the control terminal may be Gate.

The second electronic switch Q2 is connected to the second winding Np2 in series. In the embodiment of the present invention, the second electronic switch Q2 has a first terminal, a second terminal, and a control terminal. The first terminal of the second electronic switch Q2 is connected to another terminal of the second winding Np2. For example, the second electronic switch Q2 may be an n-type metal-oxide-semiconductor field effect transistor (n-MOSFET). In the second electronic switch Q2, the first terminal may be Drain, the second terminal may be Source, and the control terminal may be Gate. With reference to FIG. 1, the first electronic switch Q1 is connected to the second electronic switch Q2. A connecting node 21 is formed between the first electronic switch Q1 and the second electronic switch Q2. The connecting node 21 of the first electronic switch Q1 and the second electronic switch Q2 is provided to be connected to a current detector circuit 50.

With reference to FIG. 1 and FIG. 2, the PWM circuit 30 may be an integrated circuit (IC) and comprises a comparison unit 31 and a PWM controller 32. The comparison unit 31 has a detecting terminal DET, a setting terminal Vset for a voltage switching threshold, a PWM input terminal 310, a first signal output terminal OUT1, and a second signal output terminal OUT2. The detecting terminal DET is connected to the power input terminal 10 to detect a magnitude of an input voltage. In the embodiment of the present invention, the detecting terminal DET may be connected to the power input terminal 10 via a voltage divider circuit 33. The first signal output terminal OUT1 is connected to the control terminal of the second electronic switch Q2. The second signal output terminal OUT2 is connected to the control terminal of the first electronic switch Q1. In the embodiment of the present invention, the PWM controller 32 may be a current-mode PWM controller. The PWM controller 32 has a PWM output terminal 320. The PWM output terminal 320 is connected to the PWM input terminal 310 of the comparison unit 31. The PWM controller 32 has an input terminal CS connected to the current detector circuit 50. The PWM controller 32 has another input terminal COMP connected to the power output terminal 41 of the output circuit 40 via a feedback circuit 51. Therefore, the PWM controller 32 modulates pulse widths of a PWM signal according to current and voltage detecting results from the current detector circuit 50 and the feedback circuit 51 and outputs the PWM signal on the PWM output terminal 320 for the comparison unit 31 to receive the PWM signal.

With reference to FIG. 2, the comparison unit 31 has a comparator 34, an inverter 35, a first driver 36, and a second driver 37. The comparator 34 has a non-inverting input terminal (+), an inverting input terminal (−), and an output terminal VC1. A resistor R8 is connected between the non-inverting input terminal (+) and the output terminal VC1 for providing a delay function. The non-inverting input terminal (+) is as the detecting terminal DET. The inverting input terminal (−) is as the setting terminal Vset. The inverter 35 has an input terminal and an output terminal. The input terminal of the inverter 35 is connected to the output terminal VC1 of the comparator 34. The first driver 36 has an enable terminal EN1, an input terminal S, and the first signal output terminal OUT1. The enable terminal EN1 of the first driver 36 is connected to the input terminal of the inverter 35. The second driver 37 has an enable terminal EN2, an input terminal S, and the second signal output terminal OUT2. The enable terminal EN2 of the second driver 37 is connected to the output terminal of the inverter 35. The input terminal S of the second driver 37 is connected to the input terminal S of the first driver 36. One of the input terminal S of the first driver 36 and the input terminal S of the second driver 37 may be the PWM input terminal 310 to be connected to the PWM output terminal 320 of the PWM controller 32.

In the first driver 36, when the voltage level of the enable terminal EN1 is high, the PWM signal from the input terminal S of the first driver 36 can pass through the first signal output terminal OUT1 to be a control signal (PWM-H) to activate the second electronic switch Q2. Oppositely, when the voltage level of the enable terminal EN1 is low, the control signal (PWM-H) is as a cut-off signal, such that the second electronic switch Q2 would be operated in an open-circuited state according to the cut-off signal. Similarly, in the second driver 37, when the voltage level of the enable terminal EN2 is high, the PWM signal from the input terminal S of the second driver 37 can pass through the second signal output terminal OUT2 to be another control signal (PWM-L) to activate the first electronic switch Q1. Oppositely, when the voltage level of the enable terminal EN2 is low, the control signal (PWM-L) is as the cut-off signal for the first electronic switch Q1 to operate in an open-circuited state.

Figure 3:
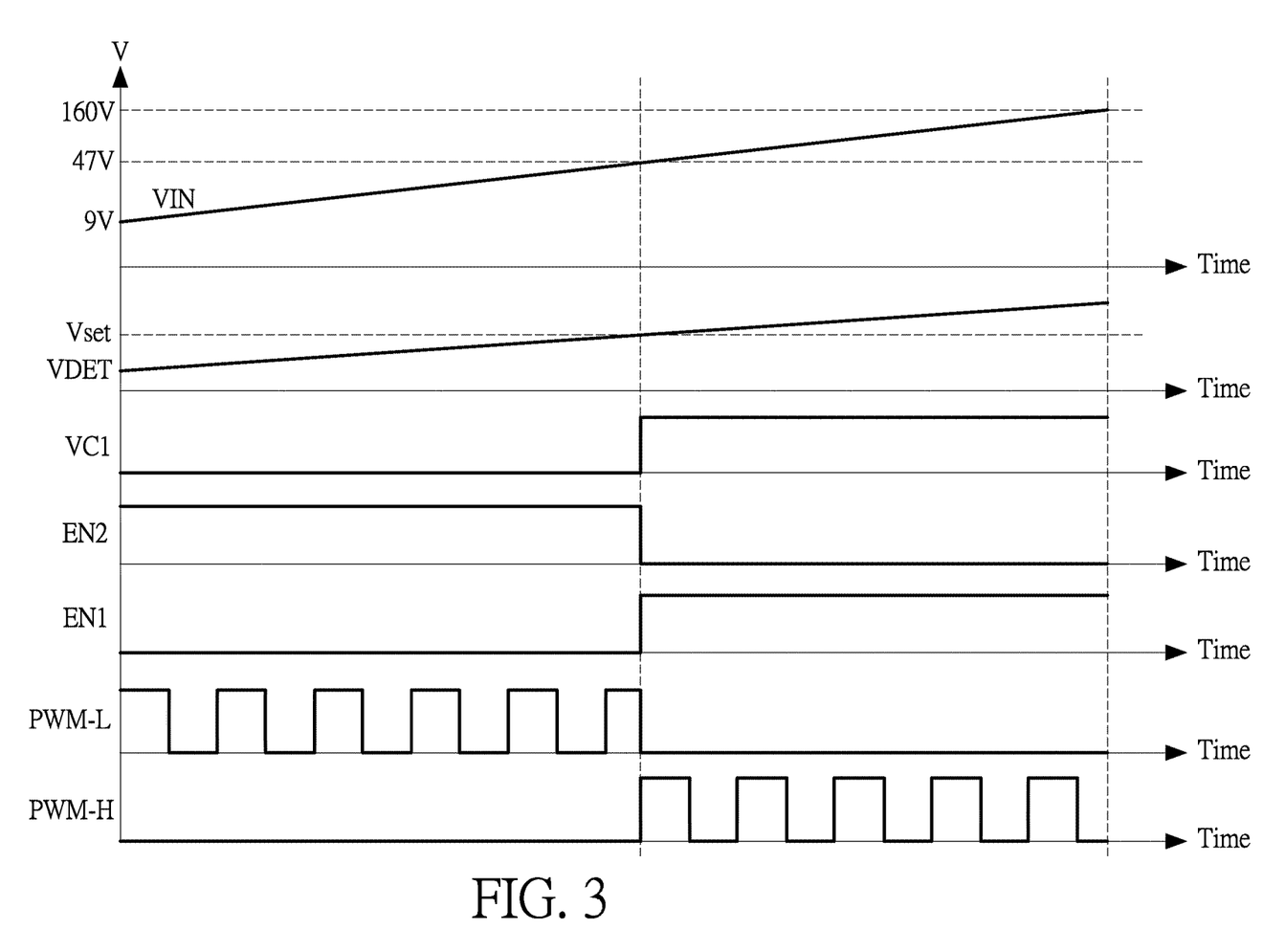
FIG. 3 is a signal sequence diagram of the present invention.

The circuit specification of the present invention is described as follows with the signal sequence diagram of FIG. 3. For example, the voltage range received by the power input terminal 10 may be a super-wide input voltage range from 9V to 160V, and a switching voltage may be 47V. Hence, the 47V times a resistor ratio of the voltage divider circuit 33 may obtain the voltage switching threshold of the setting terminal Vset. When the input voltage (+VIN) of the power input terminal 10 is lower than 47V the voltage on the detecting terminal DET of the comparator 34 is lower than the voltage switching threshold of the setting terminal Vset, such that the output terminal VC1 of the comparator 34 outputs low voltage level. At the same time, the enable terminal EN1 of the first driver 36 receives the low voltage level of the comparator 34. The control signal (PWM-H) outputted from the first signal output terminal OUT1 is deemed as the cut-off signal, and therefore the second electronic switch Q2 is turned off (operated in the open-circuited state). At the same time, the enable terminal EN2 of the second driver 37 receives the high voltage level from the inverter 35. As a result, the control signal (PWM_L) outputted from the second signal output terminal OUT2 is deemed as the PWM signal for activating the first electronic switch Q1 to work. Hence, the output winding Ns and the first winding Np1 have electromagnetic induction effect to generate a first inductive power. The first inductive power passes through the output circuit 40 and then is outputted to a rear-stage circuit or a load on the power output terminal 41.

When the input voltage (+VIN) of the power input terminal 10 is higher than 47V the voltage on the detecting terminal DET of the comparator 34 is higher than the voltage switching threshold of the setting terminal Vset, such that the output terminal VC1 of the comparator 34 outputs high voltage level. At the same time, the enable terminal EN1 of the first driver 36 receives the high voltage level of the comparator 34, and therefore the control signal (PWM-H) outputted from the first signal output terminal OUT1 is deemed as the PWM signal for activating the second electronic switch Q2 to work. At the same time, the enable terminal EN2 of the second driver 37 receives low voltage level from the inverter 35. As a result, the control signal (PWM_L) outputted from the second signal output terminal OUT2 is deemed as the cut-off signal, and therefore the first electronic switch Q1 is turned off (operated in the open-circuited state). Hence, the output winding Ns and the second winding Np2 have electromagnetic induction effect to generate a second inductive power. The second inductive power passes through the output circuit 40 and then is outputted to the rear-stage circuit or the load on the power output terminal 41.

As mentioned above, under a condition that the input voltage (+VIN) is lower than the switching voltage, the first electronic switch Q1 is activated to work by the control signal (PWM_L) and the second electronic switch Q2 is turned off. The anti-backflow device D1 may interrupt a voltage/current path coupled with the second winding Np2 for the purpose of avoiding an abnormality caused by a current from the second winding Np2 and directly entering the first winding Np1 and the first electronic switch Q1 when the first electronic switch Q1 is turned on. Under a condition that the input voltage (+VIN) is higher than the switching voltage, the second electronic switch Q2 is activated to work by the control signal (PWM_H) and the first electronic switch Q1 is turned off. For the input side of the transformer T1, higher input voltage (+VIN) means lower input current. The lower input current passing through the anti-backflow device D1 may minimize the loss on the anti-backflow device D1. Moreover, even though the input side of the transformer T1 includes two windings Np1, Np2, the cost to detect the current may be still minimized because the present invention uses the single current detector circuit 50 which is connected between a ground and the connecting node 21 of the electronic switches Q1, Q2 to detect the current on the first winding Np1 or the second winding Np2. In addition, the electronic switches Q1, Q2 may be respectively selected from appropriate electronic transistors. For example, the first electronic switch Q1 may be selected from a low-voltage switch device, and the second electronic switch Q2 may be selected from a high-voltage switch device. Hence, the electronic switches Q1, Q2 may be respectively operated within voltage ranges consistent with their specifications in order to optimize the power conversion efficiency.

In the embodiment of the present invention, comparing the first winding Np1 with the second winding Np2, because the second winding Np2 corresponds to higher input voltage (+VIN) and the first winding Np1 corresponds to lower input voltage (+VIN), a winding number of the second winding Np2 is higher than a winding number of the first winding Np1. Besides, the winding number of the first winding Np1 may be equal to a winding number of the output winding Ns. For example, when the voltage range of the input voltage (+VIN) is from 9V to 160V and the output voltage of the output circuit 40 is 5V, a ratio of Np1:Np2:Ns may be, but not limited to, 2:8:2.

In conclusion, the present invention adopts the comparison unit 31 to compare whether the input voltage (+VIN) is higher than the switching voltage, and then activates one of the first electronic switch Q1 and the second electronic switch Q2 to work according to a comparison result. When the first electronic switch Q1 is activated to work and the second electronic switch Q2 is turned off, there would be no current passing through the second winding Np2, and therefore the duty cycle of the transformer T1 is based on the turns ratio between the first winding Np1 and the output winding Ns. On the other hand, when the second electronic switch Q2 is activated to work and the first electronic switch Q1 is turned off, there would be no current passing through the first winding Np1, and therefore the duty cycle of the transformer T1 is based on the turns ratio between the second winding Np2 and the output winding Ns. According to the one-stage-two-switch circuit configuration of the present invention adopting the two windings Np1, Np2 and the two electronic switches Q1, Q2, the transformer T1 includes two turns ratios to be alternatively selected. The turns ratio between the first winding Np1 and the output winding Ns corresponds to a lower voltage range (such as 9V to 47V) of the input voltage (+VIN). The turns ratio between the second winding Np2 and the output winding Ns corresponds to a higher voltage range (such as 47V to 160V) of the input voltage (+VIN). On the whole, a combination of the lower voltage range and the higher voltage range forms the super-wide input voltage range from 9V to 160V. Therefore, the present invention may operate within the super-wide input voltage range and retain ideal power conversion efficiency.

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A wide input voltage range power converter circuit in a one-stage-two-switch configuration, comprising:
    a power input terminal;
    a switch node connected to the power input terminal;
    a transformer having:
        an input side comprising a first winding and a second winding that are connected to the switch node; and
        an output side comprising an output winding;
        wherein the first winding is directly connected to the switch node, and the second winding is connected to the switch node via an anti-backflow device;
        wherein the anti-backflow device is a single diode connected to the second winding in series and having an anode and a cathode, the anode of the single diode is directly connected to the switch node, and the cathode of the single diode is connected to the second winding;
        wherein a turns ratio between the first winding and the output winding is different from a turns ratio between the second winding and the output winding;
    a first electronic switch connected to the first winding in series and having a control terminal;
    a second electronic switch connected to the second winding in series and having a control terminal;
    a pulse width modulation (PWM) circuit comprising:
        a comparison unit having a detecting terminal connected to the power input terminal, a setting terminal for a voltage switching threshold, a PWM input terminal, a first signal output terminal connected to the control terminal of the second electronic switch, and a second signal output terminal connected to the control terminal of the first electronic switch; and
        a PWM controller having a PWM output terminal connected to the PWM input terminal of the comparison unit; and
    an output circuit connected to the output winding of the transformer and comprising a power output terminal,
    wherein the anti-backflow device interrupts a voltage/current path coupled with the second winding to avoid an abnormality caused by a current from the second winding and directly entering the first winding and the first electronic switch when the first electronic switch is turned on.

2. The power converter circuit as claimed in claim 1, wherein the switch node is directly connected to the power input terminal.

3. The power converter circuit as claimed in claim 1, wherein the comparison unit comprises:
    a comparator having:
        a non-inverting input terminal as the detecting terminal;
        an inverting input terminal as the setting terminal; and
        an output terminal, wherein a resistor is connected between the non-inverting input terminal and the output terminal of the comparator;
    an inverter having:
        an input terminal connected to the output terminal of the comparator; and
        an output terminal;
    a first driver having:
        an enable terminal connected to the input terminal of the inverter;
        an input terminal; and
        the first signal output terminal; and
    a second driver having:
        an enable terminal connected to the output terminal of the inverter;
        an input terminal connected to the input terminal of the first driver; and
        the second signal output terminal;
    wherein one of the input terminal of the first driver and the input terminal of the second driver is as the PWM input terminal.

4. The power converter circuit as claimed in claim 2, wherein the comparison unit comprises:
    a comparator having:
        a non-inverting input terminal as the detecting terminal;
        an inverting input terminal as the setting terminal; and
        an output terminal, wherein a resistor is connected between the non-inverting input terminal and the output terminal of the comparator;
    an inverter having:
        an input terminal connected to the output terminal of the comparator; and
        an output terminal;
    a first driver having:
        an enable terminal connected to the input terminal of the inverter;
        an input terminal; and
        the first signal output terminal; and
    a second driver having:
        an enable terminal connected to the output terminal of the inverter;
        an input terminal connected to the input terminal of the first driver; and
        the second signal output terminal;
    wherein one of the input terminal of the first driver and the input terminal of the second driver is as the PWM input terminal.

5. The power converter circuit as claimed in claim 1, wherein the first electronic switch is connected to the second electronic switch;
    a connecting node of the first electronic switch and the second electronic switch is connected to a current detector circuit; and
    the PWM controller has an input terminal connected to the current detector circuit.

6. The power converter circuit as claimed in claim 2, wherein
    the first electronic switch is connected to the second electronic switch;

a connecting node of the first electronic switch and the second electronic switch is connected to a current detector circuit; and the PWM controller has an input terminal connected to the current detector circuit.

7. The power converter circuit as claimed in claim 3, wherein winding number of the second winding is higher than a winding number of the first winding.

8. The power converter circuit as claimed in claim 4, wherein a winding number of the second winding is higher than a winding number of the first winding.

\* \* \* \* \*